United States Patent [19]

Chai et al.

[11] 4,324,773

[45] Apr. 13, 1982

[54] HYDROTHERMAL PROCESS AND APPARATUS FOR SYNTHESIZING CRYSTALLINE POWDERS

[75] Inventors: Bruce H. Chai, Bridgewater; Ernest Buehler, Chatham; John J. Flynn, Millington, all of N.J.

[73] Assignee: Allied Corporation, Morris Township, Morris County, N.J.

[21] Appl. No.: 230,077

[22] Filed: Jan. 30, 1981

[51] Int. Cl.³ .............................................. C01B 25/36
[52] U.S. Cl. ................................ 423/311; 156/623 R; 422/209; 422/241; 422/254
[58] Field of Search ............................... 423/309, 311; 156/623 R

[56] References Cited

U.S. PATENT DOCUMENTS 3,801,704  4/1974  Kobayashi et al. .................. 423/311
4,049,779  9/1977  Ropp .................................... 423/311

FOREIGN PATENT DOCUMENTS 597169  1/1948  United Kingdom ................ 423/311

OTHER PUBLICATIONS

Drafall and Belt, RADC-TR-80-73, Final Technical Report, Mar. 1980, (Rome Air Development Center).

*Primary Examiner*—O. R. Vertiz
*Assistant Examiner*—Wayne A. Langel
*Attorney, Agent, or Firm*—James Riesenfeld; Gerhard H. Fuchs

[57] ABSTRACT

Berlinite crystalline powder of uniform particle size and high purity is prepared by repeated thermal cycling to react a mixture of aluminum hydroxide or aluminum oxide and an excess of concentrated phosphoric acid in a sealed pressure vessel. The vessel is preferably held in a horizontal orientation and rotated about a longitudinal axis during the reaction. The product powder is useful in growing large single crystals that have surface acoustic wave applications. Crystalline powder of alpha-gallium orthophosphate may be prepared using the same apparatus and a similar procedure.

12 Claims, 1 Drawing Figure

U.S. Patent
Apr. 13, 1982
4,324,773
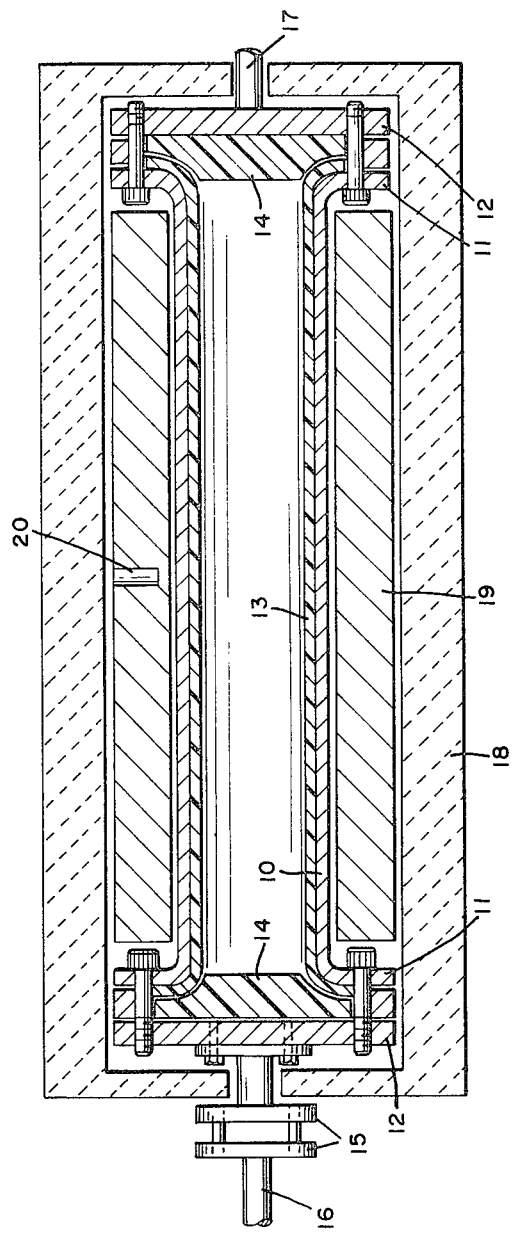

HYDROTHERMAL PROCESS AND APPARATUS FOR SYNTHESIZING CRYSTALLINE POWDERS

BACKGROUND OF THE INVENTION

1. Field of the Invention

This invention relates to a process and apparatus for preparing crystalline powders of alphaaluminum orthophosphate and alpha-gallium orthophosphate.

2. Description of the Prior Art

Alpha-aluminum orthophosphate (berlinite) and alpha-gallium orthophosphate ($GaPO_4$) are among several alpha-quartz isomorphs that have for decades been synthesized for research purposes. An attempt to grow large single crystals of berlinite began after World War II, in an effort to find new piezoelectric crystals for frequency control applications. The project ended a few years later, because success was achieved in quartz crystal growth and because quartz was considered superior for the piezoelectric devices known then. Specifically, it was concluded that berlinite had a lower Q and lower coupling coefficient than quartz. Furthermore, tests on both X and Y cuts of berlinite plates, showing a negative frequency drift with increasing temperature, indicated that there was little chance of finding a zero temperature cut similar to the AT cut of quartz.

Interest in berlinite was renewed in 1976, when Barsch and Chang found that berlinite does have temperature-compensated cuts, and that the coupling coefficient for surface acoustic wave (SAW) devices can be four times greater than for quartz.

Several processes for preparing berlinite have been reported in the technical literature (A. F. Huttenlocker, Z. Krist. 90, 508 (1935); W. Jahn et al., Chem. Erde 16, 75 (1953); and E. D. Kolb et al., J. Crystal Growth 43, 313 (1978)). Three processes for preparing $GaPO_4$ were described by Perloff (J. Amer. Cer. Soc. 39, 83 (1956)).

Recently, Drafall and Belt, of the Rome Air Development Center, described procedures for seeded hydrothermal growth of single crystals of berlinite for SAW applications. (RADC-TR-80-73, Final Technical Report, March, 1980). Among the three approaches to nutrient preparation described in their report, the best results were achieved by reacting $Al(OH)_3$ with excess $H_3PO_4$ according to the reaction:

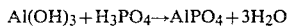

$$Al(OH)_3 + H_3PO_4 \rightarrow AlPO_4 + 3H_2O$$

The amount of acid was adjusted so that the final solution was 6 M in $H_3PO_4$. The reactants were heated in a sealed silver-lined autoclave under a gradient of 20°–30° C., with temperature increasing from 120°–250° C. at a fixed rate of about 5° C./day. Euhedral crystals in the 1–4 mm range was produced.

SUMMARY OF THE INVENTION

In accordance with the present invention, an apparatus is provided for preparing powders of alphaaluminum orthophosphate or alpha-gallium orthophosphate. The apparatus comprises, in combination, a substantially cylindrical fluoropolymer-lined pressure vessel, means for supporting the vessel with its cylinder axis in a substantially horizontal orientation, means for rotating the vessel about its cylinder axis, and means for controlling temperatures in the vessel.

In operation, the present invention provides a process for preparing crystalline powders of alpha-aluminum orthophosphate or alpha-gallium orthophosphate. The process comprises the steps of:

(a) heating a sealed pressure vessel containing a mixture comprising a compound selected from the group consisting of aluminum hydroxide, aluminum oxide, and gallium sesquioxide and an excess of concentrated phosphoric acid to a first temperature between about 180° C. and about 235° C., (b) cooling the vessel to a second temperature between about 125° C. and about 150° C., (c) repeating steps (a) and (b) at least one more time, (d) rapidly cooling the vessel from the first temperature to near ambient temperature, and (e) recovering the resultant crystalline powder.

Preferably, the pressure vessel is held in a horizontal position and rotated about a longitudinal axis during the reaction.

The present invention provides several advantages over the prior art. The apparatus is simpler, lighter, easier to use, and less expensive to build than that of the prior art. The resultant high-purity powder, consisting of uniform size, crystalline grains, is useful as nutrient material in the growth of single crystals of alpha-quartz isomorphs for SAW device applications.

BRIEF DESCRIPTION OF THE DRAWING

The FIGURE shows a sectional view of an apparatus of the present invention.

DETAILED DESCRIPTION OF THE INVENTION

This invention provides an apparatus for preparing crystalline powders that are isomorphs of alpha-quartz. The apparatus includes a substantially cylindrical pressure vessel supported with its long dimension in a horizontal orientation, means for rotating the vessel about a longitudinal axis, and means for controlling temperatures in the vessel.

The pressure vessel, or autoclave, has a fluoropolymer lining to inhibit acid corrosion of the walls. Any fluoropolymer that can withstand the conditions of temperature and pressure in the corrosive environment of the autoclave without softening substantially is suitable as a liner material. Among these, poly(tetrafluoroethylene) and PFA (copolymer of perfluorinated ethylene and perfluorinated alkylvinylether) are particularly suitable; chlorotrifluoroethylene and polyvinylidene fluoride are not, because they soften at the high temperature. In principle, the fluoropolymer could be sprayed on the autoclave walls; in practice, however, sprayed coatings contained micropores that permitted autoclave wall corrosion.

Conventional autoclaves, fabricated from high-strength materials, are suitable. A Morey-type autoclave is convenient to use and is adequate to tolerate the required pressures ($\sim$50 000 kPa). If an autoclave having a demountable seal at one end is used, the fluoropolymer lining may be machined from a solid cylinder. A tubular autoclave, having demountable seals at each end, is preferred for two reasons. First, it permits the fluoropolymer liner to be fabricated from extruded tubular stock, without machining. In addition, it makes loading and unloading of material from the autoclave, as well as cleaning the autoclave, simpler. Since the force required to seal the ends of the autoclave at a given pressure is essentially proportional to the cross-sectional area of the cylinder, a small cross section is advantageous. However, the cross section is preferably large enough to accommodate the desired volume of reactants without causing the collapsing strength of the liner to be exceeded during cooling. Autoclave dimensions, while not critical, involve a compromise among these competing factors.

The autoclave is supported with its cylinder axis horizontal to promote uniform distribution of the material. The support includes means for rotating the autoclave to promote uniform temperature and growth (without clumping) and to reduce the tendency for material to adhere to the liner. The rotation rate is not critical. The range from about 5 to 60 rpm is suitable, with 10 to 30 rpm preferred. If the rate is too low, the purposes of rotation, discussed above, are not achieved; if too high, there is a tendency for the tumbling of the particles against one another to have an undesirable grinding effect.

Surrounding the autoclave is a cylindrical furnace for heating the autoclave to about 235° C. The exterior temperature of the autoclave is monitored in a conventional manner, for example using thermocouples. Although not measured directly, the interior temperature is believed to be generally within about 5° C. of the measured temperature during heating and cooling cycles, closer at the temperature extremes. Interior temperatures are uniform to within about ±1° C.

In one embodiment, preparing powders of berlinite by the process of the present invention comprises first mixing chemical grade aluminum hydroxide fine powder with an excess of concentrated phosphoric acid. Electronic grade 85% $H_3PO_4$ is commercially available and is suitable. Heating the mixture in an autoclave then causes the following reaction to take place:

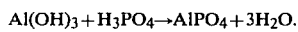

$$Al(OH)_3 + H_3PO_4 \rightarrow AlPO_4 + 3H_2O.$$

Alternatively, chemical grade aluminum oxide ($Al_2O_3$) powder may be used in place of $Al(OH)_3$, to cause the reaction:

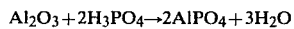

$$Al_2O_3 + 2H_3PO_4 \rightarrow 2AlPO_4 + 3H_2O$$

An advantage of using $Al_2O_3$ is that the berlinite yield is greater for a given autoclave volume, since only half as much water is generated. A disadvantage is the sluggish reaction rate. Furthermore, the reaction does not go to completion if the $Al_2O_3$ powder is too coarse (maximum particle size $>1$ μm). Just a very small quantity of $Al_2O_3$ ($<0.1\%$ of the original amount) remaining in the system can cause serious problems in subsequent single crystal growth. If the required fine powder were available at a reasonable cost, the $Al_2O_3$ process would be preferred.

The reactions require that the vessel temperature be at least about 125° C.; otherwise, the product is $AlPO_4.2H_2O$. As the reaction proceeds, the temperature is cycled, preferably between about 130° and 200° C. Berlinite shows retrograde solubility. Thus, at temperatures above about 235° C., its solubility is so low that very little material precipitates.

Preferably, a temperature cycle is completed in less than about seven days, more preferably in about one day. Of course, the first cycle, beginning at ambient temperature, takes longer than later cycles. If the rate of temperature increase is too high, there is excessive nucleation of particles, and the desirably coarse grains do not result.

The amounts of reactant are chosen to meet two goals. The first is to yield a liquid product whose acid molarity is between 5 and 8, 7.3 being particularly suitable. A ratio of about 1.5-2 mL of 85% $H_3PO_4$ per g of $Al(OH)_3$ generally yields such a product; 1.8 mL/g is preferred. If $Al_2O_3$ is used instead of $Al(OH)_3$, about 2.0-2.5 mL/g is suitable, with about 2.3 preferred.

The second goal is to maximize the yield of crystalline powder in a limited autoclave volume. If too much of the autoclave volume (i.e. $>90\%$) is filled by the reactants, a single (liquid) phase fills the entire volume at 200° C. and excessive pressures may develop. Within this volume constraint, in a preferred procedure, a quantity of fine crystalline berlinite ($<100$ mesh), the residue (after sieving) of previous syntheses, is also added to the system as seeding material. The amount of fine berlinite is a determining factor of the number of particles in the product.

Preferably, the autoclave is held with its long dimension substantially horizontal and more preferably it is also rotated about a longitudinal axis as the reaction takes place. The horizontal position provides a uniform temperature; and rotation provides agitation, which increases the reaction rate, reduces undesirable coagulation, and yields a product in loose powder form having uniform grain size. Rotation also contributes to uniform temperature in the autoclave.

Although the reaction is complete within about two days, particle size at that time is undesirably small. To produce coarser grains, the temperature is cycled repeatedly. Small grains go into solution preferentially as the temperature is reduced, and crystallites grow as the temperature is increased. Typically, the particles grow to an acceptable size in about three weeks. Because of berlinite's retrograde solubility, the reaction mass must be cooled rapidly and removed from the system to avoid dissolution of the berlinite product into the acid after the desired particle size has been achieved. To accomplish this, the autoclave is removed from the furnace and sprayed with water. Cooling to near room temperature takes about 10 to 15 minutes. More rapid cooling, while possible, would increase the stress on the liner and thus reduce its lifetime. After being cooled, the solution is filtered and the crystalline berlinite powder is washed, dried, and sieved. Particles of size less than 100 mesh are used as seeding material in later syntheses. The coarse granular berlinite powder is used in growth of single crystals. No material is wasted.

For subsequent growth of large single crystals, optimum particle size is in the range from about 20-100 mesh, with 20-50 mesh preferred (all mesh sizes quoted herein are U.S. sieve). Smaller particles tend to go into suspension, which is deleterious to the growth of large single crystals; larger particles go into solution too slowly. A narrow particle size distribution is desirable, because it provides a uniform dissolution rate and thus permits nearly all the nutrient to be used during the single crystal growth operation. For this reason, particles of size $>10$ mesh are less desirable; however, since the present process generally yields no particles that large, there is no problem. By the present process, a greater fraction of the product powder has particle size in the preferred range than is achieved by prior art processes. For example, a typical reaction yields 40 percent of the crystalline berlinite granules greater than 50 mesh, 50 percent between 50-90 mesh, and 10 percent less than 90 mesh.

Starting with chemical grade $Al(OH)_3$ and electronic grade $H_3PO_4$, emission spectroscopic analysis of the crystalline powder product shows the following impurities: Si:20 ppm, B:20 ppm, Ga:70 ppm, transition metals: <100 ppm, alkaline earths: <30 ppm, and alkalies: <20 ppm.

Similar to the process and apparatus described above for preparing berlinite are those for preparing GaPO$_4$. The latter merely involves substituting high purity (99.99%) Ga$_2$O$_3$ for Al(OH)$_3$ or Al$_2$O$_3$ and preferably cycling the temperature between about 140° C. and about 225° C., instead of the lower temperatures used in berlinite preparation. The reaction involving gallium is:

$$Ga_2O_3 + 2H_3PO_4 \rightarrow 2GaPO_4 + 3H_2O$$

The Figure depicts a sectional view of an apparatus of the present invention. The pressure vessel comprises a tubular element 10 having flanges 11 at each end for sealing two demountable caps 12. The vessel is protected from corrosion by fluoropolymer liner 13 and cap liners 14. Optionally, an O-ring may be placed at each end between fluoropolymer elements 13 and 14 to ensure sealing, particularly when a vessel of large cross section is used. The vessel is attached at one end to a demountable coupling 15 that permits the vessel to be rotated about an axial shaft 16 driven by a motor (not shown). Preferably, coupling 15 is thermally insulating to avoid heating the motor by conduction along shaft 16. At its opposite end, the vessel is attached to a shaft 17, supported in a bearing (not shown). The vessel is enclosed in split furnace 18, with split pipe 19 filling the gap that results from the flanges. A thermocouple (not shown) fitted into a hole 20 in the pipe measures the temperature. A conventional plunger seal, or other seal not requiring the flanged structure, would obviate the need for the split pipe.

The following examples are presented in order to provide a more complete understanding of the invention. The specific techniques, conditions, materials, and reported data set forth to illustrate the principles and practice of the invention are exemplary and should not be construed as limiting the scope of the invention.

EXAMPLE 1

A 3.2 L autoclave oriented with its cylinder axis horizontal was loaded with a mixture of 1300 g Al(OH)$_3$, 2.3 L of concentrated (85 wt.%) H$_3$PO$_4$, and 300 g AlPO$_4$ (size <100 mesh). The temperature of the autoclave was cycled between 130° C. and 200° C. for three weeks while the autoclave was rotated about its axis at 20 rpm. The temperature cycle period was one day. The reaction yielded 1.8 kg of berlinite having the following particle size distribution:

| | |
|---|---|
| 20–45 mesh - 283 g (15.8%) | |
| 45–60 mesh - 868 g (48.6%) | |
| 60–70 mesh - 232 g (13.1%) | |
| 70–100 mesh - 250 g (14.1%) | |
| <100 mesh - 151 g (8.45%) | |

EXAMPLE 2

The autoclave of Example 1 was loaded with 1200 g Al$_2$O$_3$ and 2.7 L of 85 wt.% H$_3$PO$_4$ (no AlPO$_4$ was added). The autoclave temperature was cycled daily between 140° C. and 185° C., while the autoclave was rotated about its axis at 20 rpm. After 25 days, 2.1 kg of berlinite had been produced having the following particle size distribution:

| | |
|---|---|
| 20–45 mesh - 106 g (5.0%) | |
| 45–100 mesh - 1860 g (87.1%) | |
| <100 mesh - 168 g (7.9%) | |

EXAMPLE 3

The autoclave of Example 1 was loaded with a mixture of 960 g Ga$_2$O$_3$, 2.5 L of 85 wt.% H$_3$PO$_4$, and 880 g α-GaPO$_4$ (size <90 mesh). The autoclave temperature was cycled between 150° C. and 210° C. for 30 days while the autoclave was rotated about its axis at 10 rpm. The temperature cycle period was one day. The reaction yielded 2080 g of α-GaPO$_4$ having the following particle size distribution:

| | |
|---|---|
| 20–50 mesh - 345 g (16.6%) | |
| 50–90 mesh - 1282 g (61.6%) | |
| <90 mesh - 453 g (21.8%) | |

We claim:
1. A process for preparing crystalline powders of alpha-aluminum orthophosphate or alpha-gallium orthophosphate comprising the sequential steps of:
  (a) heating a sealed pressure vessel containing a mixture comprising a compound selected from the group consisting of aluminum hydroxide, aluminum oxide, and gallium sesquioxide and an excess of concentrated phosphoric acid to a first temperature between about 180° C. and about 235° C.,
  (b) cooling the vessel to a second temperature between about 125° C. and about 150° C.,
  (c) repeating steps (a) and (b) at least one more time,
  (d) rapidly cooling the vessel from the first temperature, to near ambient temperature, and
  (e) recovering the resultant crystalline powder.

2. The process of claim 1 in which the mixture includes aluminum hydroxide or aluminum oxide.

3. The process of claim 2 in which the mixture includes fine crystalline alpha-aluminum orthophosphate.

4. The process of claim 2 in which the temperature of the vessel is cycled between about 130° C. and about 200° C.

5. The process of claim 1 in which the mixture includes gallium sesquioxide.

6. The process of claim 5 in which the mixture includes fine crystalline alpha-gallium orthophosphate.

7. The process of claim 5 in which the temperature of the mixture is cycled between about 140° C. and about 225° C.

8. The process of claim 1 in which the pressure vessel has a long dimension that is substantially horizontal.

9. The process of claim 8 in which the pressure vessel is rotated about a longitudinal axis during the reaction.

10. The process of claim 1 in which the volume of the mixture is less than about 90 percent of the volume of the vessel.

11. The process of claim 1 in which the period of the temperature cycle is less than about seven days.

12. The process of claim 11 in which the period of the temperature cycle is about one day.

* * * * *